United States Patent (10) Patent No.: US 7,732,840 B2
Matsuoka et al. (45) Date of Patent: Jun. 8, 2010

(54) SEMICONDUCTOR DEVICE (75) Inventors: Fumiyoshi Matsuoka, Kawasaki (JP);
Yohji Watanabe, Yokohama (JP); Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 11/864,041

(22) Filed: Sep. 28, 2007

(65) Prior Publication Data
US 2008/0079473 A1 Apr. 3, 2008

(30) Foreign Application Priority Data
Sep. 29, 2006 (JP) .............................. 2006-266142

(51) Int. Cl.
*H01L 21/76* (2006.01)
(52) U.S. Cl. ................ 257/213; 257/231; 257/E29.246
(58) Field of Classification Search ................. 257/347, 257/197; 365/233, 154, 104; 438/197
See application file for complete search history.

(56) References Cited

U.S. PATENT DOCUMENTS

| 2005/0001237 A1* | 1/2005 | Hayakawa et al. ........... 257/197 |
| 2005/0047266 A1* | 3/2005 | Shionoiri et al. ........... 365/233 |
| 2005/0082613 A1* | 4/2005 | Taguchi ........................ 257/347 |
| 2005/0118753 A1* | 6/2005 | Efland et al. ................. 438/197 |
| 2006/0160296 A1* | 7/2006 | Tran et al. .................... 438/231 |
| 2006/0164881 A1* | 7/2006 | Oki ............................. 365/154 |

FOREIGN PATENT DOCUMENTS

JP 07-263577 10/1995
JP 2005-123285 5/2005

* cited by examiner

*Primary Examiner*—Jerome Jackson, Jr.
*Assistant Examiner*—Dale Page
(74) *Attorney, Agent, or Firm*—Turocy & Watson, LLP (57) ABSTRACT

A second-conductivity-type transistor includes a source and drain formed by a second-conductivity-type diffusion layer formed on a first-conductivity-type semiconductor layer; and a gate formed on the first-conductivity-type semiconductor layer sandwiched between the second-conductivity-type diffusion layer through an insulating film A first-conductivity-type transistor includes a source and drain formed by a first-conductivity-type diffusion layer formed on a second-conductivity-type semiconductor layer; and a gate formed on the second-conductivity-type semiconductor layer sandwiched between the first-conductivity-type diffusion layer through an insulating film. The second-conductivity-type diffusion layer for configuring the second-conductivity-type transistor is divided into a plurality of regions, each of which being separated by a device isolation region formed on the first-conductivity-type semiconductor layer. The first-conductivity-type diffusion layer for configuring the first-conductivity-type transistor is divided into a plurality of regions, each of which being separated by a device isolation region formed on the second-conductivity-type semiconductor layer.

12 Claims, 8 Drawing Sheets

SEMICONDUCTOR DEVICE

CROSS REFERENCE TO RELATED APPLICATIONS

This application is based on and claims the benefit of priority from prior Japanese Patent Application No. 2006-266142, filed on Sep. 29, 2006, the entire contents of which are incorporated herein by reference.

BACKGROUND OF THE INVENTION

1. Field of the Invention

The present invention relates to a semiconductor device, and in particular to a semiconductor device for use in a Static Random Access Memory (SRAM) in which data (potential) is retained and accumulated by cross-wiring of inverter circuits or in flip-flop circuits in logic circuits, etc.

2. Description of the Related Art

As disclosed in Japanese Patent Laid-Open No. JP07-263577A, an SRAM with a flip-flop circuit comprises two inverters each including a p-type MOS (Metal Oxide Semiconductor) transistor and an n-type MOS transistor. In the inverter circuits, drains of the p-type MOS transistor and the n-type MOS transistor are connected to each other, and gates of the p-type MOS transistor and the n-type MOS transistor are connected to each other. Moreover, sources of these transistors are connected to the power-source potential and the ground potential, respectively. The cross wiring of such the two inverter circuits may form one SRAM cell. In the SRAM of this configuration, let "1" be the case where one of the nodes is in high-level and let "0" be the case where the node is in low-level, which enables storing of binary information (potentials).

On the other hand, in such a semiconductor device including an SRAM, some situations may arise where an α-ray would be incident in a semiconductor device, which is radiated from a radioactive element such as U or Th contained in the package or solder. In this case, a phenomenon is known that many pairs of electrons and holes are produced, the effect of which could inverse the stored information (potentials) and impose some errors. These types of errors are referred to as "soft-errors" as they can be corrected by rewriting of signals and be of transient malfunction.

Specifically, as for metal as a conductor, electrons and holes that are generated by α-rays should not move within the metal of conductors since the inner potentials remain constant. In addition, as for insulators, electrons and holes that are generated by α-rays could not move within the insulators.

However, for semiconductors with p-n junctions, when a reverse bias voltage is applied to the p-n junction, electrons and holes that are generated at the time of transmission of α-rays would move to the positive electrodes and to the negative electrodes respectively, each of which leading to the noise current. Therefore, the semiconductor region is susceptible to the soft-errors, especially in the region adjacent the region of the p-n junction.

Meanwhile, the recent improvement of technology for removing radioactive elements contained in the package material or solders have reduced the problems of soft-errors than before that are caused by α-rays. On the other hand, neutron rays, which are contained in cosmic rays, have attracted public attention as the cause of occurrence of soft-errors. This means that the neutron rays, which are contained in the cosmic rays falling onto the ground, are incident on the semiconductor material such as Si, and collide with a Si atom or the like that resides within the material, destroying the atomic nucleus to produce high-energy secondary particles. These high-energy secondary particles then pass through the semiconductor, thereby generating pairs of electrons and holes as in the α-rays, which could cause soft-errors.

The difference between the soft-error caused by neutron rays and the other caused by α-rays is that the neutron rays have about ten times higher density of pairs of electrons and holes per unit-length than the α-rays. The higher the altitude from the ground, the more the neutron rays would exist. Consequently, in the semiconductor devices such as SRAM mounted on airplanes, the soft-errors, especially those caused by the neutron rays, would become a problem.

Actually, for the α-rays, it is possible to eliminate the elements of the sources and to deal with the externally incident sources by means of shields, etc., and the countermeasures are apparent since their sources have been already identified. However, for the neutron rays, although they are contained in the cosmic rays and are of externally incident nature, the neutron rays offer such an extremely high transmittance as compared to the α-rays that is nearly impossible to shield against. As such, there is no apparent resolution.

Moreover, as the degree of semiconductor device integration increases with the progress of refinement, their soft-error tolerance tends to be reduced for the more refined semiconductor devices. Therefore, it can be thought that this problem would gain increased attention in the future. Patent documents of Japanese Patent Laid-Open No. JP07-263577A and JP2005-12328A disclose inventions related to the semiconductor devices with an increased soft-error tolerance.

SUMMARY OF THE INVENTION

A semiconductor device in accordance with an aspect of the present invention comprises at least two inverter circuits. The inverter circuits each includes a second-conductivity-type transistor in which a source and drain are formed by a second-conductivity-type diffusion layer formed on a first-conductivity-type semiconductor layer, and a gate is formed on the first-conductivity-type semiconductor layer sandwiched between the second-conductivity-type diffusion layers through an insulating film, and a first-conductivity-type transistor in which a source and drain are formed by a first-conductivity-type diffusion layer formed on a second-conductivity-type semiconductor layer, and a gate is formed on the second-conductivity-type semiconductor layer sandwiched between the first-conductivity-type diffusion layers through an insulating film. The second-conductivity-type diffusion layer for configuring the second-conductivity-type transistor is divided into a plurality of regions, each separated by a trench isolation region formed on the first-conductivity-type semiconductor layer. The first-conductivity-type diffusion layer for configuring the first-conductivity-type transistor is divided into a plurality of regions, each separated by a trench isolation region formed on the second-conductivity-type semiconductor layer.

DETAILED DESCRIPTION OF THE EMBODIMENTS

An embodiment of the present invention will now be described below.

Figure 1:
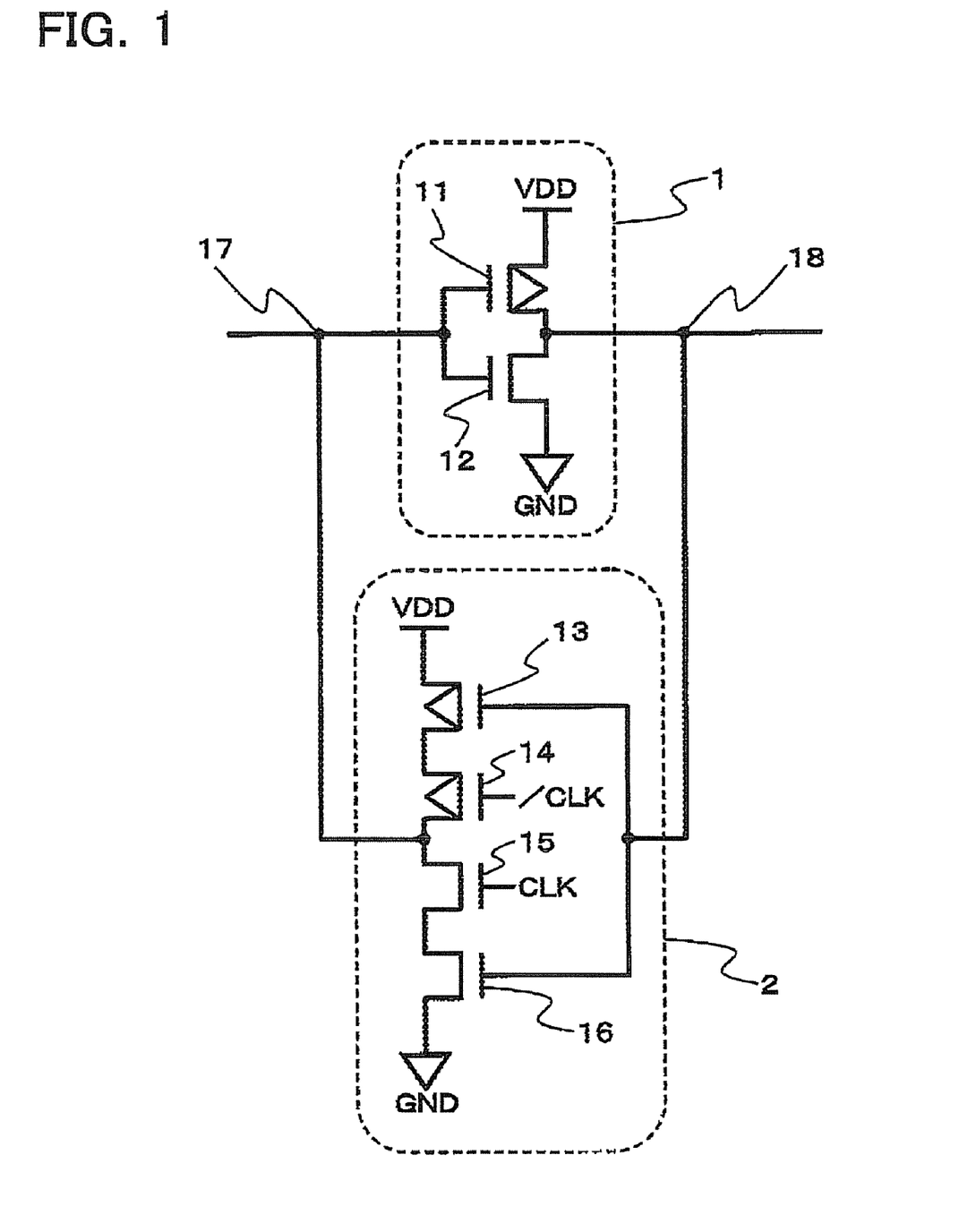
FIG. 1 is a circuit diagram of a flip-flop circuit.

FIG. 1 is a circuit diagram of a latch unit in a flip-flop circuit as a semiconductor device of this embodiment.

As illustrated in FIG. 1, an inverter circuit 1 comprises a p-type MOS transistor 11 and an n-type MOS transistor 12. Specifically, drains of the p-type MOS transistor 11 and the n-type MOS transistor 12 are connected to each other. This connection node corresponds to an output terminal of the inverter circuit 1.

A source of the p-type MOS transistor 11 is connected to a power-source potential VDD, and a source of the n-type MOS transistor 12 is connected to a ground potential GND. In addition, gates of the p-type MOS transistor 11 and the n-type MOS transistor 12 are connected to each other and correspond to an input terminal of the inverter circuit 1.

On the other hand, a latch feedback inverter circuit 2 comprises a p-type MOS transistor 13, a p-type MOS transistor 14, an n-type MOS transistor 15, and an n-type MOS transistor 16, which are connected in series with each other. Specifically, the p-type MOS transistor 13 and the p-type MOS transistor 14 are connected in series with each other, and a source of the p-type MOS transistor 13 is connected to the power-source potential VDD. The n-type MOS transistor 15 and the n-type MOS transistor 16 are connected in series with each other, and a source of the n-type MOS transistor 16 is connected to the ground potential GND.

Drains of the p-type MOS transistor 14 and the n-type MOS transistor 15 are connected to each other, and this connection node corresponds to an output terminal of the latch feedback inverter circuit 2. In addition, gates of the p-type MOS transistor 14 and the n-type MOS transistor 15 are connected to "/CLK" and "CLK" respectively that provide complementary clock signals. Gates of the p-type MOS transistor 13 and the n-type MOS transistor 16 are connected to each other. This connection node corresponds to an input terminal of the latch feedback inverter circuit 2. Such a latch feedback inverter circuit 2 is referred to as a "clocked inverter circuit".

The output terminals of the latch feedback inverter circuit 2, i.e., the drains of the p-type MOS transistor 14 and the n-type MOS transistor 15 are connected to the input terminals of the inverter circuit 1, i.e., the gates of the p-type MOS transistor 11 and the n-type MOS transistor 12. This connection node forms a storage node 17 for storing data.

In addition, the output terminals of the inverter circuit 1, i.e., the drains of the p-type MOS transistor 11 and the n-type MOS transistor 12 are connected to the input terminals of the latch feedback inverter circuit 2, i.e., the gates of the p-type MOS transistor 13 and the n-type MOS transistor 16. This connection node forms a storage node 18 for storing data.

According to the above configuration, the inverter circuits 1 and 2 form a flip-flop circuit that comprises the storage nodes 17 and 18.

In this configuration, signals corresponding to "L" level (GND) and "H" level (VDD) are input to each gate of the p-type MOS transistor 14 and the n-type MOS transistor 15 as the complementary clock signals "/CLK" and "CLK". In this state, if the storage node 17 corresponds to the "H" level (VDD), the storage node 18 corresponds to the "L" level (GND), which states would be maintained accordingly. In this case, let "1" be the "H" level (VDD) and let "0" be the "L" level (GND), and binary information is stored in the storage node 17.

Figure 2:
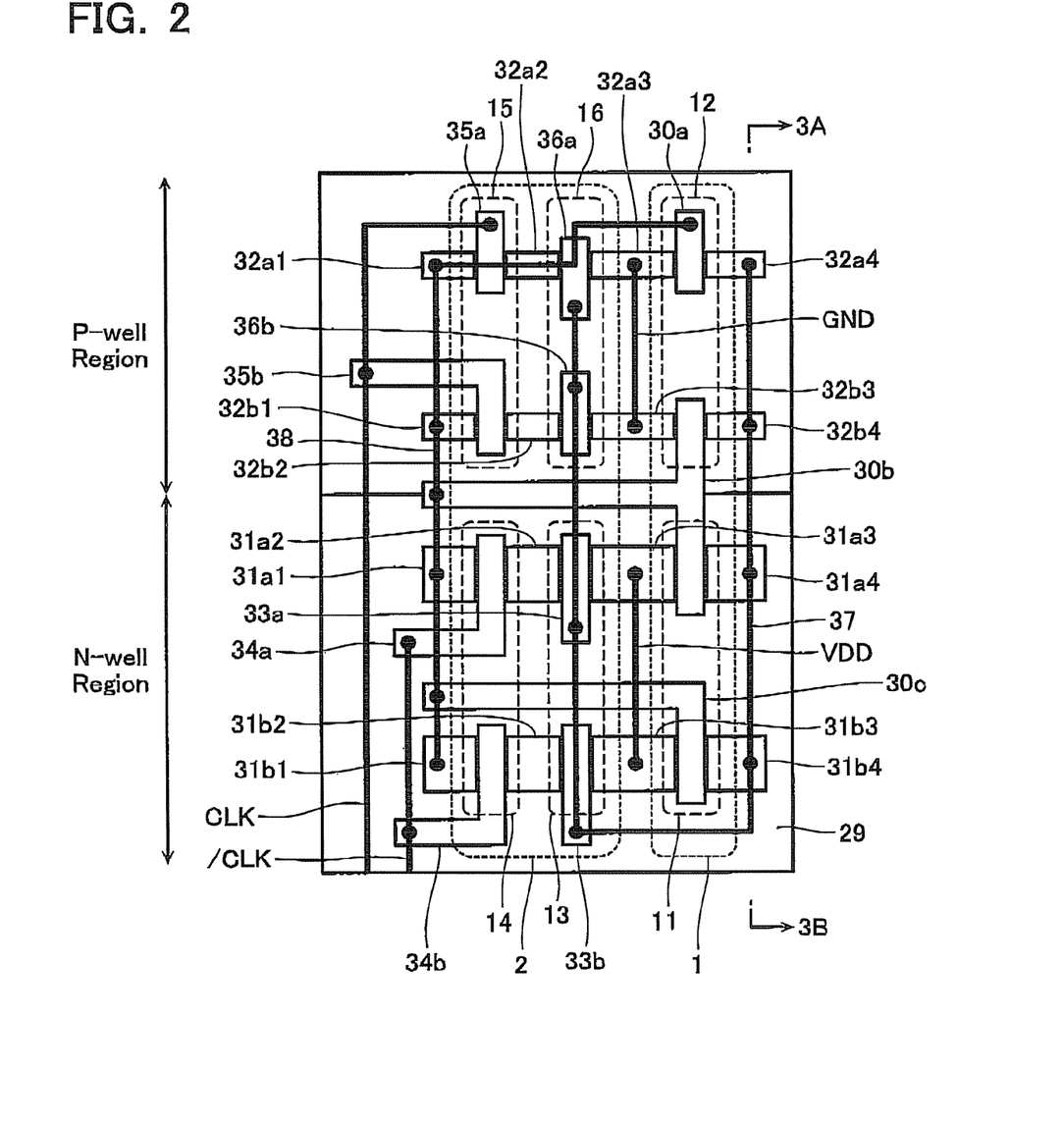
FIG. 2 is a plan view of a substrate in accordance with a first embodiment.

Then, in the circuit illustrated in FIG. 1, an arrangement of devices 11 through 16 on a silicon substrate will be described below. FIG. 2 illustrates a plan view of the latch unit in the flip-flop circuit of this embodiment; and FIG. 3 illustrates a sectional view taken along the line 3A-3B of FIG. 2.

Figure 3:
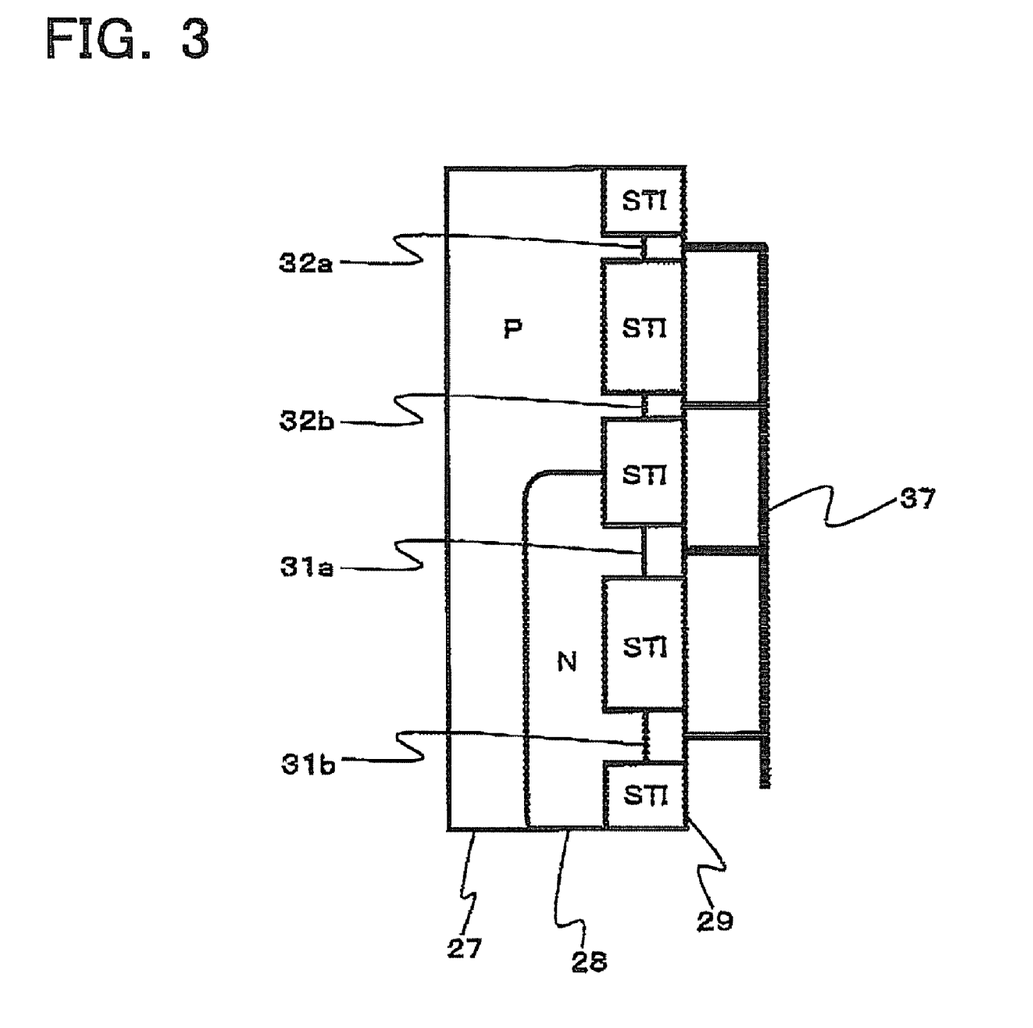
FIG. 3 is a sectional view of the substrate in accordance with the first embodiment.

As illustrated in FIG. 3, an n-type semiconductor layer 28 is formed on a portion of a p-type silicon substrate 27 as a P-type semiconductor layer. The n-type semiconductor layer 28 serves as an N-type well of the P-type MOS transistors 11, 13 and 14.

Furthermore, n-type diffusion layers 32a and 32b are formed on a surface of the p-type silicon substrate 27. These n-type diffusion layers 32a and 32b serve as a source and a drain of the N-type MOS transistors 12, 15, and 16.

P-type diffusion layers 31a and 31b are formed on a surface of the n-type semiconductor layer 28. These P-type diffusion layers 31a and 31b serve as a source and a drain of the P-type MOS transistors 11, 13, and 14.

In addition, each n-type diffusion layer 32a, 32b and each p-type diffusion layer 31a, 31b are separated by a shallow trench isolation (STI) region 29 that is formed by an oxide film or the like.

The P-type diffusion layers 31a, 31b and the n-type diffusion layers 32a, 32b are separated under the gate electrodes (30a, 30b, 30c, 33a, 33b, 34a, 34b, 35a, 35b, 36a, 36b), as shown in FIG. 2. Specifically, The P-type diffusion layer 31a includes P-type diffusion layer 31a1, 31a2, 31a3, and 31a4 from the left in FIG. 2. The P-type diffusion layer 31b includes P-type diffusion layer 31b1, 31b2, 31b3, and 31b4 from the left in FIG. 2. The N-type diffusion layer 32a includes N-type diffusion layer 32a1, 32a2, 32a3, and 32a4 from the left in FIG. 2. The N-type diffusion layer 32b includes N-type diffusion layer 32b1, 32b2, 32b3, and 32b4 from the left in FIG. 2.

As illustrated in FIG. 2, the inverter circuit 1 comprises the p-type MOS transistor 11 and the n-type MOS transistor 12. Gate electrodes 30a, 30b, and 30c of the p-type MOS transistor 11 and the n-type MOS transistor 12 are connected to one another through a metal wire 38. The metal wire 38 configures the input terminal of the inverter circuit 1.

In addition, a drain of the p-type MOS transistor 11 formed on the p-type diffusion layers 31a4 and 31b4, and a drain of the n-type MOS transistor 12 formed on the n-type diffusion layers 32a4 and 32b4, are connected to each other through a metal wire 37. That is, all of the p-type diffusion layers 31a4, 31b4, the n-type diffusion layers 32a4 and 32b4 are commonly connected to the metal wire 37. The metal wire 37 corresponds to the output terminal of the inverter circuit 1.

In addition, the latch feedback inverter circuit 2 comprises the p-type MOS transistor 13, the p-type MOS transistor 14, the n-type MOS transistor 15, and the n-type MOS transistor 16. The source of the p-type MOS transistor 13 is formed by the same p-type diffusion layers 31a3 and 31b3 as the source of the p-type MOS transistor 11 of the inverter circuit 1. The p-type diffusion layers 31*a*3 and 31*b*3 are connected to the power-source voltage VDD.

In addition, the source of the n-type MOS transistor 16 is formed by the same n-type diffusion layers 32*a*3 and 32*b*3 as the source of the n-type MOS transistor 12 of the inverter circuit 1. These n-type diffusion layers 32*a*3 and 32*b*3 are connected to the ground voltage GND.

Gates 33*a* and 33*b* of the p-type MOS transistor 13 and gates 36*a* and 36*b* of the n-type MOS transistor 16 are connected to one another through the metal wire 37. The metal wire 37 corresponds to the input terminal of the latch feedback inverter circuit 2. The metal wire 37 is also connected to the output terminals of the inverter circuit 1 mentioned above, i.e., the drain of the p-type MOS transistor 11 (p-type diffusion layers 31*a*4 and 31*b*4) and the drain of the n-type MOS transistor 12 (n-type diffusion layers 32*a*4 and 32*b*4).

Gate electrodes 34*a* and 34*b* of the p-type MOS transistor 14 and gate electrodes 35*a* and 35*b* of then-type MOS transistor 15 are connected to "/CLK" and "CLK" respectively that provide complementary clock signals.

In addition, the drain of the p-type MOS transistor 14 formed on the p-type diffusion layers 31*a*1 and 31*b*1 and the drain of the n-type MOS transistor 15 formed on the n-type diffusion layers 32*a*1 and 32*b*1 are connected to one another through the metal wire 38. The metal wire 38 corresponds to the output terminal of the latch feedback inverter circuit 2. The metal wire 38 is connected to the gate electrodes 30*a*, 30*b*, and 30*c* of the p-type MOS transistor 11 and the n-type MOS transistor 12, i.e., the input terminal of the inverter circuit 1.

As described above, the output terminal of the inverter circuit 1 is connected to the input terminal of the latch feedback inverter circuit 2, and the output terminal of the latch feedback inverter circuit 2 is connected to the input terminal of the inverter circuit 1, thereby configuring complementary potential-retained storage circuits.

As illustrated in FIG. 2 and FIG. 3, each of the p-type MOS transistor 11 of the inverter circuit 1, the p-type MOS transistor 13 of the latch feedback inverter circuit 2, and the p-type MOS transistor 14 of the latch feedback inverter circuit 2 comprises the p-type diffusion layers 31*a* and 31*b* for configuring a drain and a source thereof, respectively. These p-type diffusion layers 31*a* and 31*b* are formed on the two separate regions, between which the shallow trench isolation (STI) region 29 is formed.

In addition, each of the n-type MOS transistor 12 of the inverter circuit 1, the n-type MOS transistor 15 of the latch feedback inverter circuit 2, and the n-type MOS transistor 16 of the latch feedback inverter circuit 2 comprises the n-type diffusion layers 32*a* and 32*b* for configuring each drain and source. These n-type diffusion layers 32*a* and 32*b* are formed on the two separate regions, between which the shallow trench isolation (STI) region 29 is formed.

Further, the shallow trench isolation (STI) region 29 is also formed between the p-type diffusion layer 31*a* and the n-type diffusion layer 32*b*.

Figure 9:
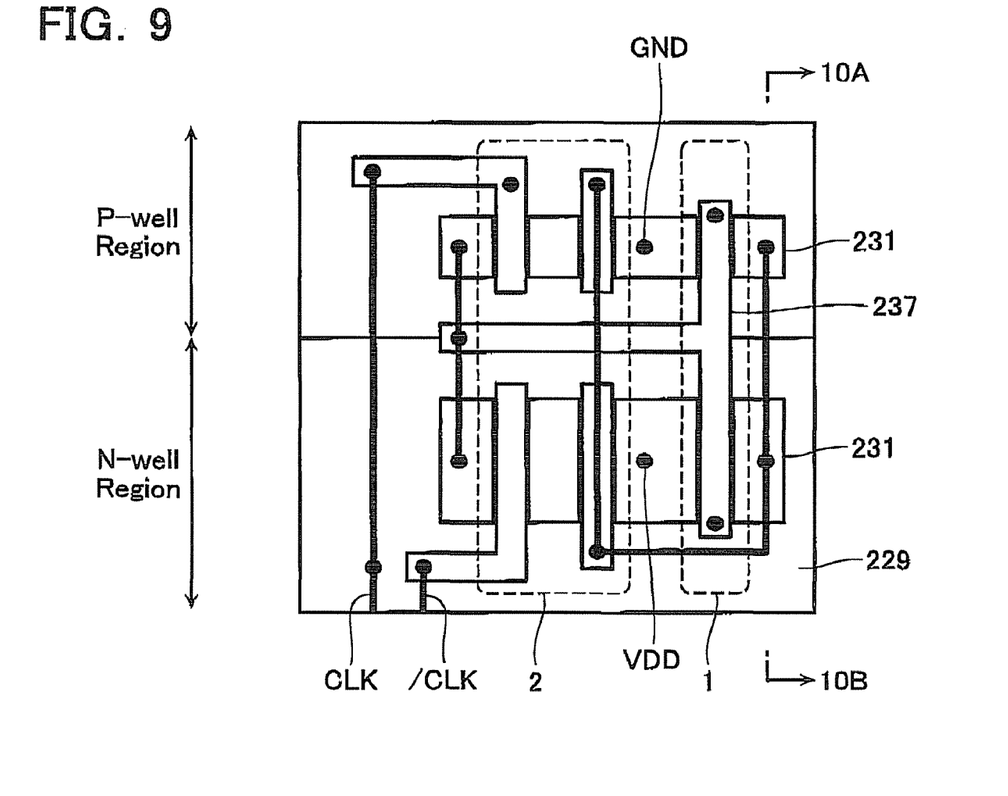
FIG. 9 is a plan view of the substrate illustrating a normal arrangement in the circuit illustrated in FIG. 1.
Figure 10:
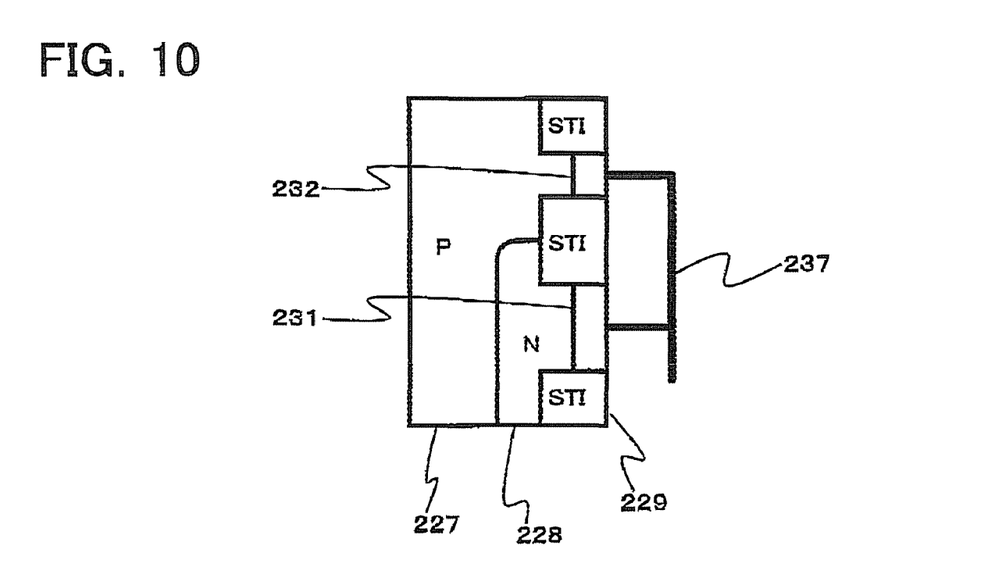
FIG. 10 is a sectional view of the substrate illustrating a normal arrangement in the circuit illustrated in FIG. 1.

FIG. 9 is a plan view and FIG. 10 is a sectional view (taken along the line 10A-10B of FIG. 9) for a normal arrangement of devices in the circuit illustrated in FIG. 1. In this normal configuration, an n-type semiconductor substrate 228 is formed on a p-type semiconductor substrate 227, a single (not divided in the cross section of 10A-10B in FIG. 9) n-type diffusion layer 232 is formed on a surface of the p-type semiconductor substrate 227, and a single (not divided in the cross section of 10A-10B in FIG. 9) p-type diffusion layer 231 is formed on a surface of the n-type semiconductor substrate 228. In this embodiment, unlike the normal configuration, the p-type diffusion layer is divided into two p-type diffusion layers 31*a* and 31*b*, and the n-type diffusion layer is divided into two n-type diffusion layers 32*a* and 32*b*. Consequently, the area of individual diffusion layers can be made smaller by division, while maintaining the same gross area and same volume of these layers. Thus, it is possible to reduce the inflow amount of noise charges for the whole diffusion layers that are produced by a pair of electron and hole generated by α-rays or neutron rays.

In addition, increasing arrangement intervals between the individual divided diffusion layers enables reduction in the probability of noise charges inflowing to the divided diffusion layers at the same time, which are produced by the pair of electron and hole generated by the same α-ray or neutron ray, which would result in the reduction of the inflow amount of the noise charges for the whole diffusion layers, thereby increasing the tolerance against soft-errors.

Meanwhile, it turned out that the circuit having the configuration illustrated in FIG. 1 according to this embodiment produced fewer soft-errors than the circuit having a configuration without division of diffusion layers. That is, comparing the devices in FIGS. 9 and 10 with the devices of this embodiment illustrated in FIGS. 2 and 3, it turned out that the devices of this embodiment have higher soft-error tolerance.

Second Embodiment

Figure 4:
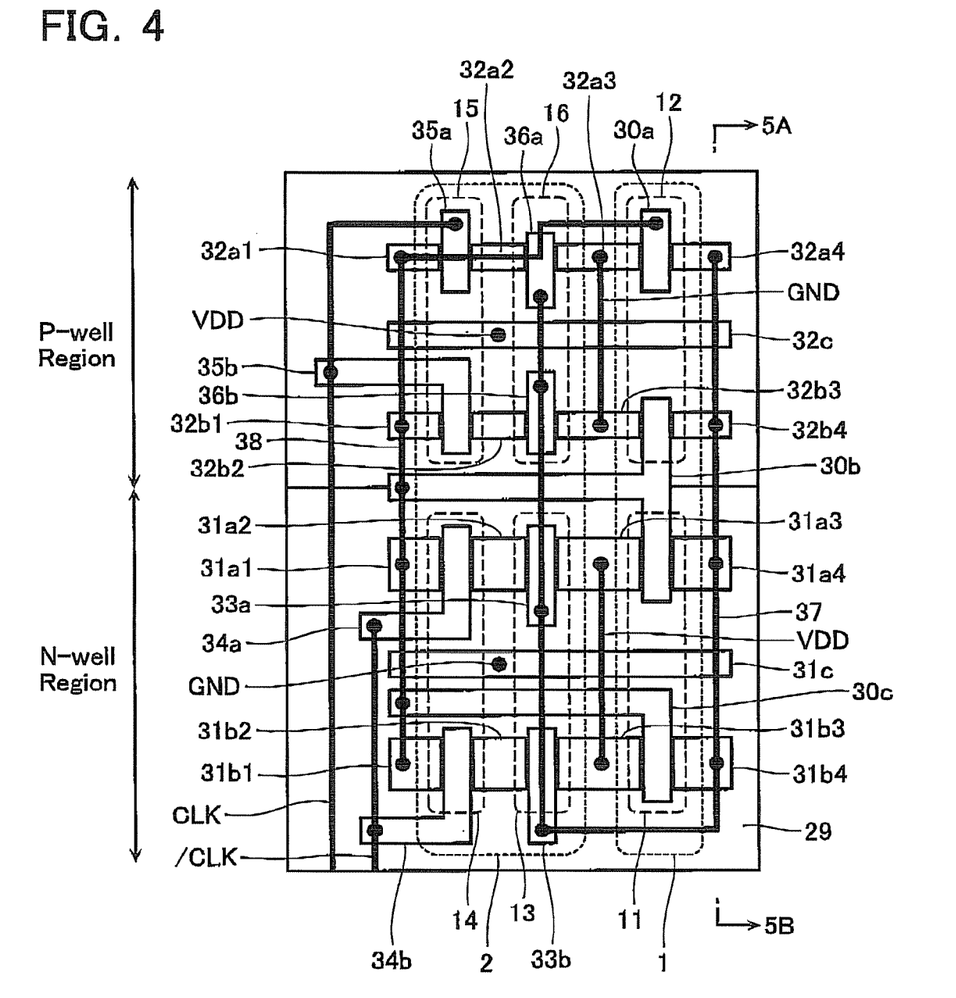
FIG. 4 is a plan view of a substrate in accordance with a second embodiment.

An arrangement of devices in accordance with a second embodiment will now be described below. This embodiment relates to another example of device arrangement for providing the circuit of a first embodiment illustrated in FIG. 1. FIG. 4 illustrates a plan view of the flip-flop circuit in accordance with this embodiment; and FIG. 5 illustrates a sectional view taken along the line 5A-5B of FIG. 4.

Figure 5:
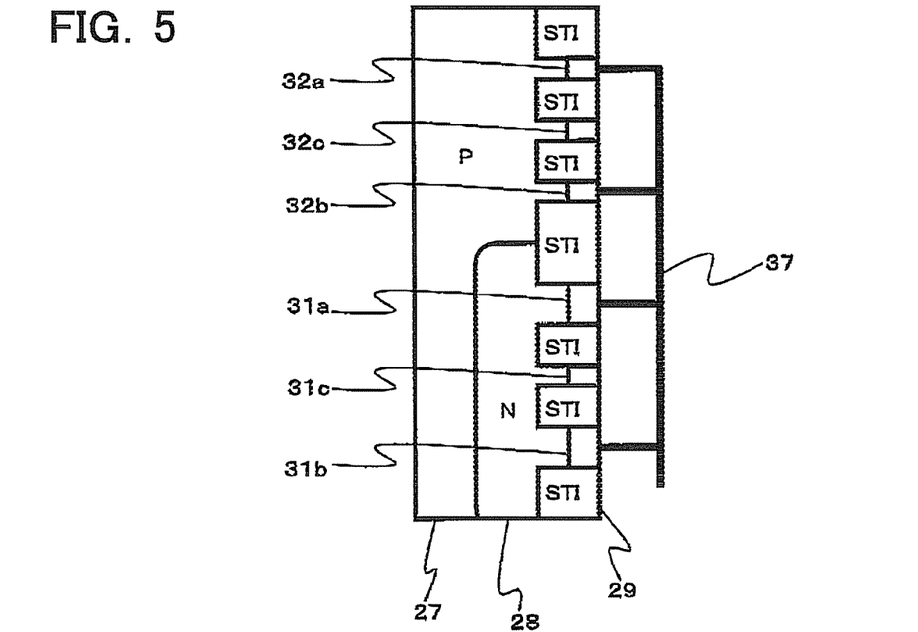
FIG. 5 is a sectional view of the substrate in accordance with the second embodiment.

As illustrated in FIG. 5, the n-type semiconductor layer 28 is formed on a portion of the p-type silicon substrate 27 corresponding to a p-type semiconductor layer, and the n-type diffusion layers 32*a*, 32*b*, and 32*c* are further formed on the surface of the p-type silicon substrate 27.

On the other hand, the p-type diffusion layers 31*a*, 31*b*, and 31*c* are formed on the surface of the n-type semiconductor layer 28. The n-type diffusion layer 32*a*, 32*b*, 32*c*, and the p-type diffusion layer 31*a*, 31*b*, 31*c* are separated from one another by a shallow trench isolation (STI) region 29 formed by an oxide film or the like.

In this embodiment, the n-type diffusion layers 32*a*, 32*b* and the p-type diffusion layers 31*a*, 31*b* are connected to one another through the metal wires 37 and 38 in each region, respectively, in the same way as in the first embodiment. The n-type diffusion layer 32*c* is connected to the power-source potential VDD serving as a reverse bias. In addition, the p-type diffusion layer 31*c* is connected to the ground potential GND serving as a reverse bias.

In this way, by connecting the n-type diffusion layer 32*c* to the power-source potential VDD serving as a reverse bias, even if such electrons are generated in the p-type silicon substrate 27 that would become noise charges due to the incident α-rays or neutron rays, these electrons are collected to the n-type diffusion layers 32*c* as well as the n-type diffusion layer 32*a* and 32*c*. Consequently, it would be possible to reduce the probability of electrons inflowing to the n-type diffusion layers 32*a* and 32*b*, which were generated in the p-type silicon substrate 27 when α-rays or neutron rays were incident thereto, thereby increasing the soft-error tolerance.

In addition, the holes, which were generated in the n-type semiconductor layer 28 would be collected to the p-type diffusion layers 31c as well as the p-type diffusion layer 31a and 31b that is connected to the ground potential GND serving as a reverse bias. Consequently, it would also be possible to reduce the probability of holes inflowing to the p-type diffusion layers 31a and 31b, which were generated in the n-type semiconductor layer 28 when α-rays or neutron rays were incident thereto, thereby increasing the soft-error tolerance.

As described above, this embodiment has a device structure with more higher soft-error tolerance. In this respect, as illustrated in FIGS. 4 and 5, the n-type diffusion layer 32c, which is applied with the reverse bias of the power-source potential VDD, is preferably formed between the n-type diffusion layers 32a and 32b, each corresponding to the source and drain of the n-type MOS transistor. Such a configuration enables the intervals between each region to be extended on which the n-type diffusion layers 32a and the n-type diffusion layers 32b are formed, thereby reducing the possibility of electrons, which were generated by the same α-rays or neutron rays, inflowing to both of the n-type diffusion layer 32a and the n-type diffusion layer 32b. Further, more electrons can be absorbed from among the generated electrons at the n-type diffusion layer 32c to which the reverse bias is applied, which electrons could inflow to the n-type diffusion layers 32a and 32b, thereby further increasing the soft-error tolerance.

Similarly, the p-type diffusion layer 31c, to which the reverse bias of the ground potential GND is applied, is preferably formed between the p-type diffusion layers 31a and 31b, each corresponding to the source and drain of the p-type MOS transistor. Since the intervals between each region can be extended on which the p-type diffusion layer 31a and the p-type diffusion layer 31b are formed, it is possible to reduce the possibility of holes, which were generated by the same α-rays or neutron rays, inflowing to both of the p-type diffusion layer 31a and the p-type diffusion layer 31b. Further, more holes can be absorbed from among the generated electrons at the p-type diffusion layer 31c to which the reverse bias is applied, which holes could inflow to the p-type diffusion layers 31a and 31b, thereby further increasing the soft-error tolerance.

Third Embodiment

Figure 6:
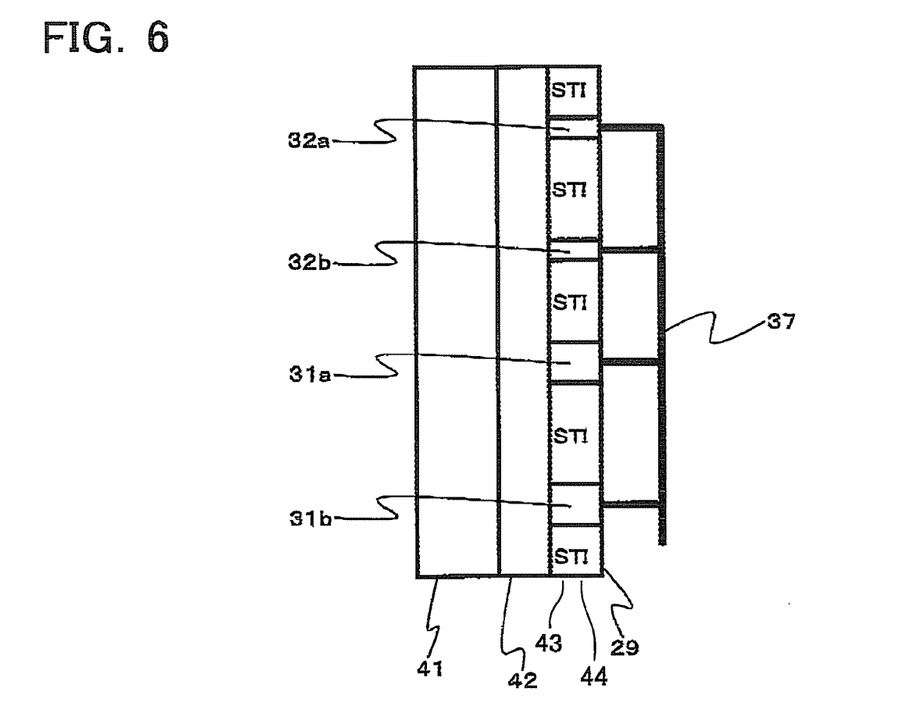
FIG. 6 is a sectional view of a substrate in accordance with a third embodiment.

An arrangement of devices in accordance with a third embodiment will now be described below. This embodiment is still another example of the device arrangement in the circuit illustrated in FIG. 1, illustrating an example with an SOI (Silicon On Insulator) substrate. The planar shape for the flip-flop circuit of this embodiment is similar to that of FIG. 2. FIG. 6 illustrates a sectional view taken along the line 3A-3B of FIG. 2. As illustrated in FIG. 6, the semiconductor device of this embodiment comprises an SOI substrate where a silicon p-type semiconductor layer 43 is formed on an insulating layer 42 formed on a semiconductor substrate 41 such as silicon. In this SOI substrate, an n-type semiconductor layer 44 is formed on a portion of the surface of the p-type semiconductor layer 43 (Note that the P-type semiconductor layer 43 is not included in the 3A-3B cross section shown in FIG. 6. It exists in a direction perpendicular to the paper seen from the P-type diffusion layers 31a and 31b).

The SOI substrate would prevent any noise charge from inflowing to the n-type diffusion layers 32a and 32b or the p-type diffusion layers 31a and 31b due to the existence of the insulating layer 42, even if electrons or holes that could be noise charges were generated in the semiconductor substrate 41. In addition, the area of the p-n junction would be made smaller, thereby further increasing the soft-error tolerance.

As compared to the case with a semiconductor bulk substrate, the SOI substrate of this embodiment has higher soft-error tolerance, which may further increase the soft-error tolerance.

Fourth Embodiment

Figure 7:
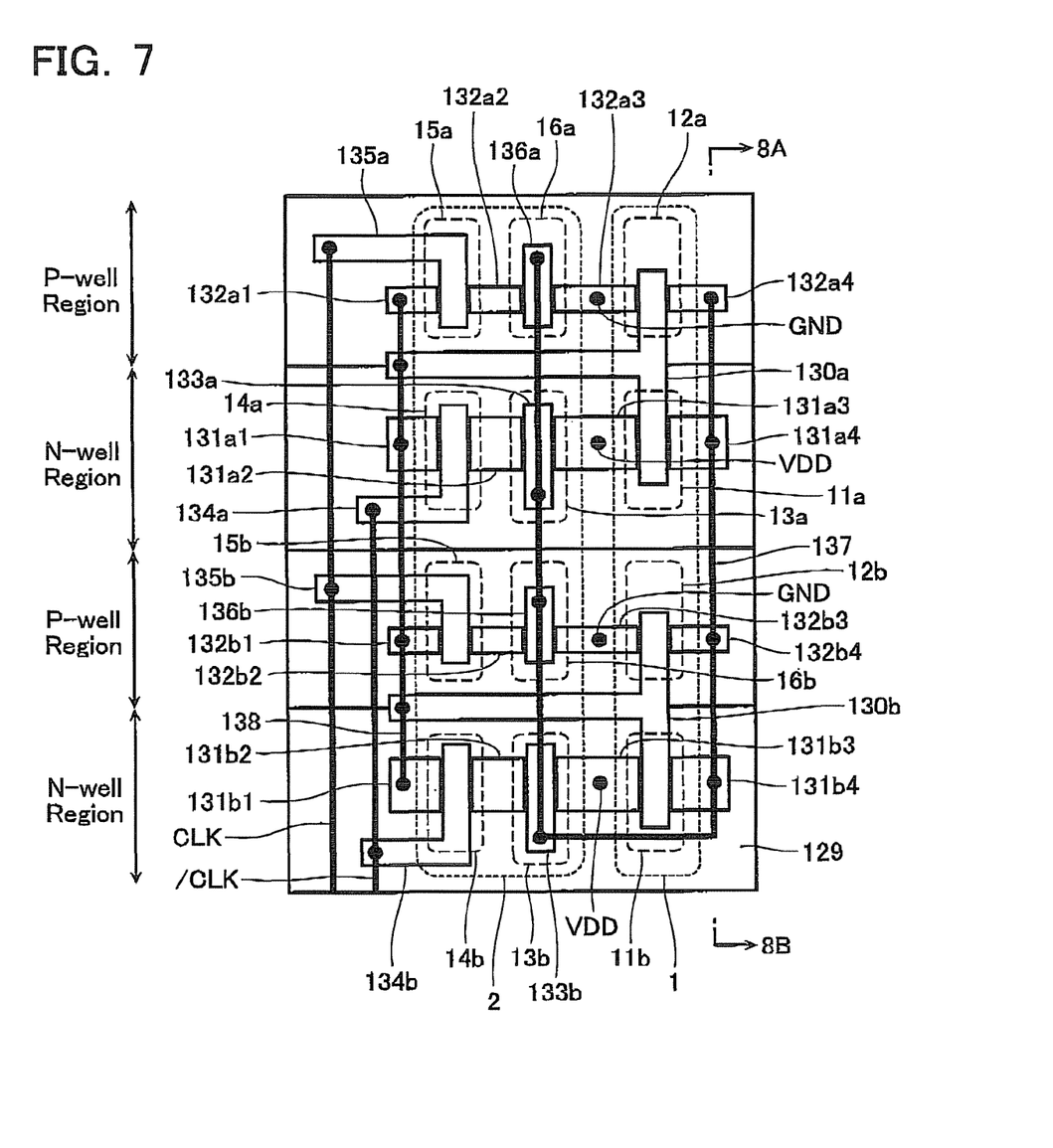
FIG. 7 is a plan view of a substrate in accordance with a fourth embodiment.

An arrangement of devices in accordance with a fourth embodiment will now be described below. This embodiment is another example of the device arrangement in the circuit illustrated in FIG. 1. FIG. 7 illustrates a plan view of the flip-flop circuit of this embodiment; and FIG. 8 illustrates a sectional view taken along the line 8A-8B of FIG. 7.

Figure 8:
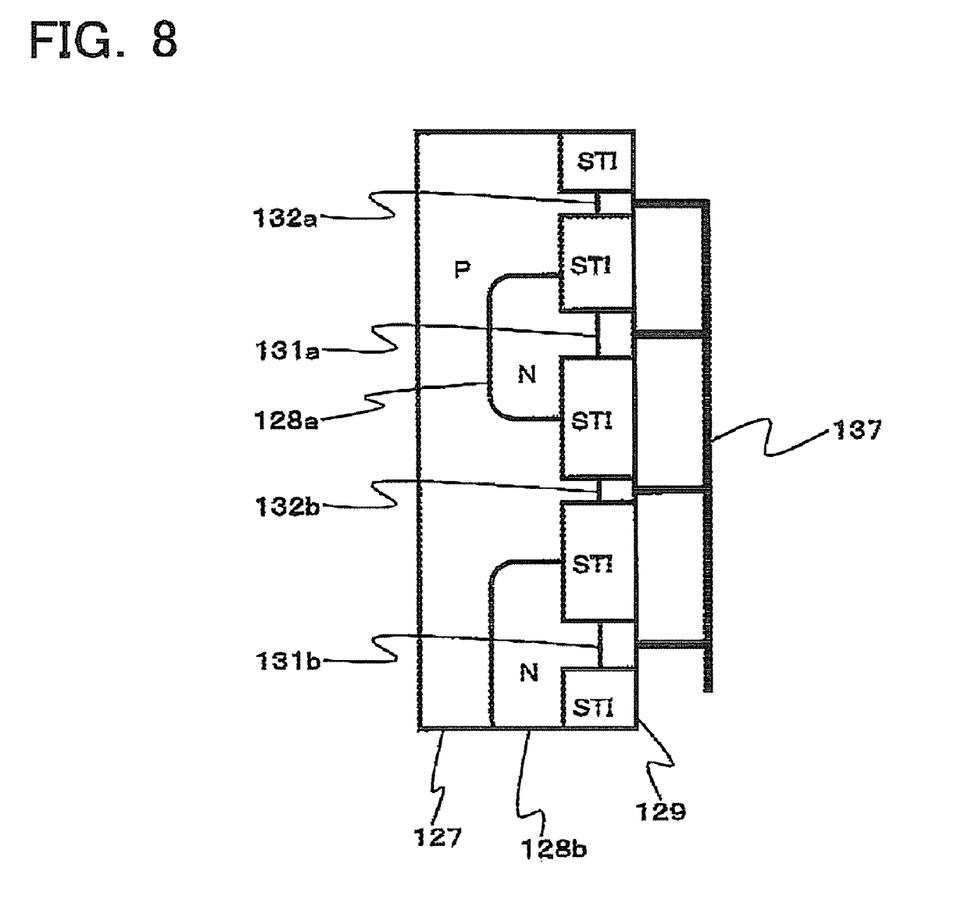
FIG. 8 is a sectional view of the substrate in accordance with the fourth embodiment.

As illustrated in FIG. 8, a plurality of n-type semiconductor layers 128a and 128b are formed on a portion of the surface of a p-type silicon substrate 127 as a p-type semiconductor layer. Further, n-type diffusion layers 132a and 132b are formed on the surface of the p-type silicon substrate 127.

P-type diffusion layers 131a and 131b are formed on each surface of the n-type semiconductor layers 128a and 128b. Further, the n-type diffusion layer 132a, 132b and the p-type diffusion layer 131a, 131b are separated from one another by a shallow trench isolation (STI) region 129 formed by an oxide film or the like.

The P-type diffusion layers 131a, 131b and the n-type diffusion layer 132a, 132b are separated under the gate electrodes (130a, 130b, 133a, 133b, 134a, 134b, 135a, 135b, 136a, 136b), as shown in FIG. 7. Specifically, the P-type diffusion layer 131a includes P-type diffusion layer 131a1, 131a2, 131a3, and 131a4 from the left in FIG. 7. The P-type diffusion layer 131b includes P-type diffusion layer 131b1, 131b2, 131b3, and 131b4 from the left in FIG. 7. The N-type diffusion layer 132a includes N-type diffusion layer 132a1, 132a2, 132a3, and 132a4 from the left in FIG. 7. The N-type diffusion layer 132b includes N-type diffusion layer 132b1, 132b2, 132b3, and 132b4 from the left in FIG. 7.

As illustrated in FIG. 7, the inverter circuit 1 comprises the p-type MOS transistors 11 (11a, 11b) and the n-type MOS transistors 12 (12a, 12b). Gate electrodes 130a and 130b of the p-type MOS transistors 11 (11a, 11b) and the n-type MOS transistors 12 (12a, 12b) are connected to one another through a metal wire 138. These gate electrodes 130a and 130b correspond to the input terminals of the inverter circuit 1.

In addition, the drain of the p-type MOS transistor 11 (11a, 11b) formed on the p-type diffusion layers 131a4 and 131b4, and the drain of the n-type MOS transistor 12 (12a, 12b) formed on the n-type diffusion layers 132a4 and 132b4, are connected to one another through a metal wire 137. The metal wire 137 corresponds to the output terminal of the inverter circuit 1. In this respect, the p-type MOS transistors 11 (11a, 11b) and the n-type MOS transistors 12 (12a, 12b) are formed in a plurality of divided regions. These plural divided regions form one transistor.

In addition, the latch feedback inverter circuit 2 comprises the p-type MOS transistors 13 (13a, 13b), the p-type MOS transistors 14 (14a, 14b), the n-type MOS transistors 15 (15a, 15b), and the n-type MOS transistors 16 (16a, 16b). In this respect, each of the p-type MOS transistors 13 (13a, 13b), the p-type MOS transistors 14 (14a, 14b), the n-type MOS transistors 15 (15a, 15b), and the n-type MOS transistors 16 (16a, 16b) is formed in a plurality of divided regions. These plural divided regions form one transistor.

A source of the p-type MOS transistors 13 (13a, 13b) shares the p-type diffusion layers 131a3 and 131b3 with a source of the p-type MOS transistors 11 (11a, 11b) of the inverter circuit 1. These diffusion layers 131a3 and 131b3 are connected to the power-source voltage VDD. In addition, a source of the n-type MOS transistors 16 (16a, 16b) shares the n-type diffusion layers 132a3 and 132b3 with a source of the n-type MOS transistors 12 (12a, 12b) of the inverter circuit 1. These diffusion layers 132a3 and 132b3 are connected to the ground voltage GND.

Gates 133a and 133b of the p-type MOS transistors 13 (13a, 13b) and gates 136a and 136b of the n-type MOS transistors 16 (16a, 16b) are connected to one another through the metal wire 137. The metal wire 137 forms an input terminal of the latch feedback inverter circuit 2.

The metal wire 137 is also connected to the p-type diffusion layers 131a4 and 131b4 that correspond to the drain region of the p-type MOS transistors 11 (11a, 11b) and to the n-type diffusion layers 132a4 and 132b4 that correspond to the drain region of the n-type MOS transistors 12 (12a, 12b). Gate electrodes 134a and 134b of the p-type MOS transistors 14 (14a, 14b) and gate electrodes 135a and 135b of the n-type MOS transistors 15 (15a, 15b) are connected to "/CLK" and "CLK" respectively that provide complementary clock signals.

In addition, the drain of the p-type MOS transistor 14 (14a, 14b) formed on the p-type diffusion layers 131a1, 131b1 and the drain of the n-type MOS transistor 15 (15a, 15b) formed on the n-type diffusion layers 132a1, 132b1 are connected to one another through the metal wire 138. The metal wire 138 forms an output terminal of the latch feedback inverter circuit 2. The metal wire 138 is also connected to the gate electrodes 130a and 130b of the p-type MOS transistor 11 (11a, 11b) and the n-type MOS transistor 12 (12a, 12b).

As described above, the output terminal of the inverter circuit 1 and the input terminal of the latch feedback inverter circuit 2 are connected to each other, and the output terminal of the latch feedback inverter circuit 2 and the input terminal of the inverter circuit 1 are connected to each other, thereby configuring complementary potential-retained storage circuits.

As illustrated in FIGS. 7 and 8, the p-type diffusion layers 131a and 131b configures the drain and source regions of: the p-type MOS transistor 11 (11a, 11b) in the inverter circuit 1; the p-type MOS transistor 13 (13a, 13b) in the latch feedback inverter circuit 2; and the p-type MOS transistor 14 (14a, 14b) in the latch feedback inverter circuit 2. The p-type diffusion layers 131a and 131b are formed dividedly in two areas in the direction of 8A-8B.

Also, the N-type diffusion layers 132a and 132b configures the drain and source regions of: the N-type MOS transistor 12 (12a, 12b) in the inverter circuit 1; the N-type MOS transistor 15 (15a, 15b) in the latch feedback inverter circuit 2; and the N-type MOS transistor 16 (16a, 16b) in the latch feedback inverter circuit 2. The N-type diffusion layers 132a and 132b are formed dividedly in two areas in the direction of 8A-8B.

The p-type diffusion layers 131a, 131b and the n-type diffusion layers 132a, 132b are alternately formed with shallow trench isolation (STI) regions 129 therebetween. This enables the intervals to be further extended for forming the p-type diffusion layer 131a and the p-type diffusion layer 131b, and for forming the n-type diffusion layer 132a and the n-type diffusion layer 132b. Consequently, it would be possible to further reduce the inflow amount of the noise charges that are produced by the pair of electron and hole generated by the same α-rays or neutron rays, thereby further increasing the tolerance against soft-errors.

In addition, although in the first embodiment illustrated in FIG. 3, the width of the shallow trench isolation (STI) region is simply extended when the intervals are extended between the p-type diffusion layers 131a and 131b or between the n-type diffusion layers 132a and 132b, in this embodiment, the overhead of area can be reduced by alternate placement of the reverse-conductivity type diffusion layers.

Although the semiconductor device of the present invention have been described in detail with respect to embodiments thereof, the present invention is not intended to be limited to the above embodiments, and it may take various forms other than the ones herein illustrated and described. For example, a P-type well may be formed on a P-type substrate, and an N-type diffusion layer may be formed thereon. Alternatively, either one of P-type transistors or N-type transistors may be formed divided into plural regions.

What is claimed is:

1. A semiconductor device comprising at least two inverter circuits, the inverter circuits each including a second-conductivity-type transistor in which a source and drain are formed by a second-conductivity-type diffusion layer formed on a first-conductivity-type semiconductor layer, and a gate is formed on the first-conductivity-type semiconductor layer sandwiched between the second-conductivity-type diffusion layers through an insulating film, and a first-conductivity-type transistor in which a source and drain are formed by a first-conductivity-type diffusion layer formed on a second-conductivity-type semiconductor layer, and a gate is formed on the second-conductivity-type semiconductor layer sandwiched between the first-conductivity-type diffusion layers through an insulating film, wherein the second-conductivity-type diffusion layer for configuring a single second-conductivity-type transistor is divided into a plurality of second regions, each of the plurality of second regions being separated by a trench isolation region formed on the first-conductivity-type semiconductor layer, the trench isolation region penetrating the second-conductivity-type diffusion layer to reach the first-conductivity-type semiconductor layer, and the first-conductivity-type diffusion layer for configuring a single first-conductivity-type transistor is divided into a plurality of first regions, each of the plurality of first regions being separated by a trench isolation region formed on the second-conductivity-type semiconductor layer, the trench isolation region penetrating the first-conductivity-type diffusion layer to reach the second-conductivity-type semiconductor layer.

2. The semiconductor device according to claim 1, wherein the divided second-conductivity-type diffusion layers used as the source of the second-conductivity-type transistor are connected through a first wire, and the divided first-conductivity-type diffusion layers used as the source of the first-conductivity-type transistor are connected through a second wire.

3. The semiconductor device according to claim 2, wherein the first wire is given a first potential, and the second wire is given a second potential different from the first potential.

4. The semiconductor device according to claim 2, wherein the divided first-conductivity-type diffusion layers used as the drain of the first-conductivity type transistor and the divided second-conductivity-type diffusion layers used as the drain of the second-conductivity-type transistor are commonly connected to a third wire.

5. The semiconductor device according to claim 1, wherein the first-conductivity-type transistor and the second-conductivity-type transistor for configuring one of the inverter circuits have their gates commonly connected through a fourth wire.

6. The semiconductor device according to claim 1, wherein
- at least one of the second-conductivity-type diffusion layers divided into the plurality of regions is applied with a reverse bias voltage, and
- at least one of the first-conductivity-type diffusion layers divided into the plurality of regions applies a reverse bias voltage.

7. The semiconductor device according to claim 6, wherein the first-conductivity-type diffusion layer applied with the reverse bias voltage is sandwiched between the other first-conductivity-type diffusion layers, and the second-conductivity-type diffusion layer applied with the reverse bias voltage is sandwiched between the other second-conductivity-type diffusion layers.

8. The semiconductor device according to claim 1, wherein the at least two inverter circuits are formed on an SOI substrate.

9. The semiconductor device according to claim 1, wherein the divided second-conductivity-type diffusion layers and the divided first-conductivity-type diffusion layers are alternately formed through the device isolation regions, respectively.

10. The semiconductor device according to claim 1, wherein at least one of the inverter circuits is a clocked inverter circuit.

11. The semiconductor device according to claim 1, wherein the first-conductivity-type semiconductor layer is a first-conductivity-type semiconductor substrate, and the second-conductivity-type semiconductor layer is a second-conductivity-type diffusion layer formed on a surface of the semiconductor substrate.

12. The semiconductor device according to claim 1, wherein the device isolation region comprises an STI device isolating film.

* * * * *